US006587800B1

(12) United States Patent
Parker et al.

(10) Patent No.: US 6,587,800 B1
(45) Date of Patent: Jul. 1, 2003

(54) REFERENCE TIMER FOR FREQUENCY MEASUREMENT IN A MICROPROCESSOR

(75) Inventors: Douglas R. Parker, Forest Grove, OR (US); Keng Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 208 days.

(21) Appl. No.: 09/607,770

(22) Filed: Jun. 30, 2000

(51) Int. Cl.[7] .............................................. G06F 11/00
(52) U.S. Cl. ..................... 702/79; 702/69; 702/106; 702/124; 702/177; 702/182; 702/189
(58) Field of Search ........................... 702/65, 69, 75, 702/78, 79, 106, 107, 117, 118, 124, 132, 136, 177, 178, 183, 182, 189, 193, FOR 113–114, FOR 117, FOR 119, FOR 134–135, FOR 142, FOR 154, FOR 156, FOR 158, FOR 170–171; 714/814, 815; 324/76.15, 76.38, 76.48; 327/392, 544

(56) References Cited

U.S. PATENT DOCUMENTS

| 3,786,433 | A | * | 1/1974 | Notley et al. ............. 340/172.5 |
|---|---|---|---|---|
| 4,495,621 | A | * | 1/1985 | Nakagomi et al. .............. 371/6 |
| 4,531,193 | A | * | 7/1985 | Yasuhara et al. ............ 364/551 |
| 4,589,066 | A | * | 5/1986 | Lam et al. ...................... 371/47 |
| 4,594,565 | A | * | 6/1986 | Barreras ................. 331/108 A |
| 4,627,060 | A | * | 12/1986 | Huang et al. .................. 371/62 |
| 4,644,498 | A | * | 2/1987 | Bedard et al. ............... 364/900 |
| 4,705,970 | A | * | 11/1987 | Turnpaugh ................... 307/600 |
| 4,809,280 | A | * | 2/1989 | Shonaka ....................... 714/55 |
| 4,868,525 | A | * | 9/1989 | Dias ............................ 331/111 |
| 4,956,842 | A | * | 9/1990 | Said ............................. 371/62 |
| 4,965,800 | A | * | 10/1990 | Farnbach .................... 371/22.1 |
| 5,063,355 | A | * | 11/1991 | Sasaki et al. ............. 328/129.1 |
| 5,251,220 | A | * | 10/1993 | Schutte ......................... 371/55 |
| 5,408,645 | A | * | 4/1995 | Ikeda et al. .................. 395/575 |
| 5,438,328 | A | * | 8/1995 | Kweon .................. 340/825.63 |
| 5,594,865 | A | * | 1/1997 | Saitoh .................... 395/185.08 |
| 5,680,593 | A | * | 10/1997 | Hiiragizawa ................ 713/500 |
| 5,864,663 | A | * | 1/1999 | Stolan .......................... 714/55 |
| 6,263,450 | B1 | * | 7/2001 | Predko ........................ 713/502 |

* cited by examiner

Primary Examiner—Marc S. Hoff
Assistant Examiner—Carol S Tsai
(74) Attorney, Agent, or Firm—Blakely, Sokoloff, Taylor & Zafman LLP

(57) ABSTRACT

A timer on a microprocessor includes a vibrator formed by a comparator, a capacitor, three reference voltages, and switched current sources, which charge and discharge the capacitor. The vibrator oscillates at two different amplitudes to generate two timing windows, one at high amplitude and the other at low amplitude. A counter counts incoming clocks and times out after a fixed number of vibrator oscillations. Logic starts the timing windows and subtracts incoming clock measurements taken during the two timing windows. The logic subtraction cancels errors accumulated from the multiple ramps of the capacitor in the vibrator. The subtraction allows more precise measurement of incoming clocks. If the clocks counted exceed a threshold value, the microprocessor shuts down due to over clocking.

22 Claims, 12 Drawing Sheets

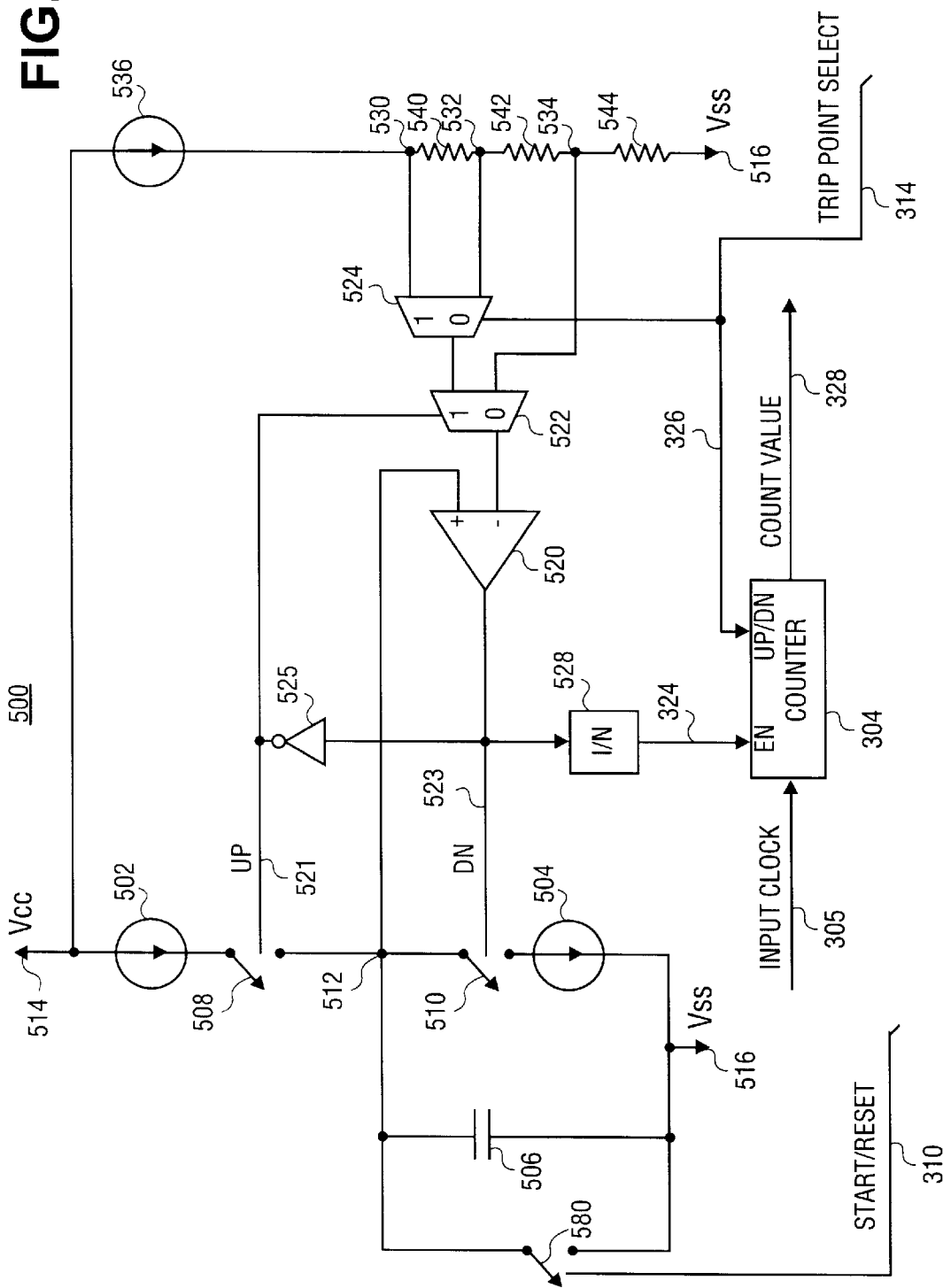

REFERENCE TIMER FOR FREQUENCY MEASUREMENT IN A MICROPROCESSOR

BACKGROUND OF THE INVENTION

1. Field of the Invention

The invention is related to microprocessors and microprocessor technology, and in particular to microprocessor timers.

2. Background Information

Microprocessors use clocks to synchronize the operations of the various circuits inside the microprocessor. The bus speed and a clock multiplier determine the speed at which the microprocessor core runs. For example, an Intel® Pentium® II 266 megahertz (MHz) microprocessor typically has a bus speed of 66 MHz and a clock multiplier of four.

From time to time computer users may try to run their microprocessors at higher speeds, ostensibly to get better performance. This typically is referred to as "over clocking." There are many risks associated with over clocking, however. For example, operating at frequencies greater than the designed frequency can cause the microprocessor to overheat, which can cause it to become unstable, experience data corruption errors, etc. Over clocking can void warranties, shorten the microprocessor's lifespan or the lifespan of other computer components. Sometimes, an over clocked microprocessor cannot be returned to its normal frequency and the effects of over clocking remain forever. This means that the microprocessor may be permanently damaged.

To minimize over clocking, conventionally, the microprocessor has an integrated reference timer that monitors the frequency. If the timer detects that the microprocessor is running too fast, the timer will initiate a microprocessor shut down.

Conventional reference timers are capacitor-based, which have limitations, however. The behaviors of the on-die capacitors used are difficult to predict, primarily due to variation in capacitor manufacturing processes. Integrated capacitors tend to be non-linear, as well. The non-linearity and process sensitivity reduce the viable range over which a capacitor's voltage can be charged. Sometimes the variations are so extreme that it is difficult to accurately determine frequencies and the timer fails to initiate a microprocessor shut down in response to over clocking.

The first solution is to use a single capacitor and ramp it up and down multiple times. This solution is troublesome because errors accumulate for each ramp up transition and each ramp down transition. The accumulated errors result in a loss of precision that may be intolerable.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 5 is a schematic diagram of the timer depicted in FIG. 3;

DETAILED DESCRIPTION OF THE ILLUSTRATED EMBODIMENTS

A reference timer is described in detail herein. In the following description, numerous specific details are provided, such as particular currents, voltages (or potentials), types of fuses and transistors, etc. to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
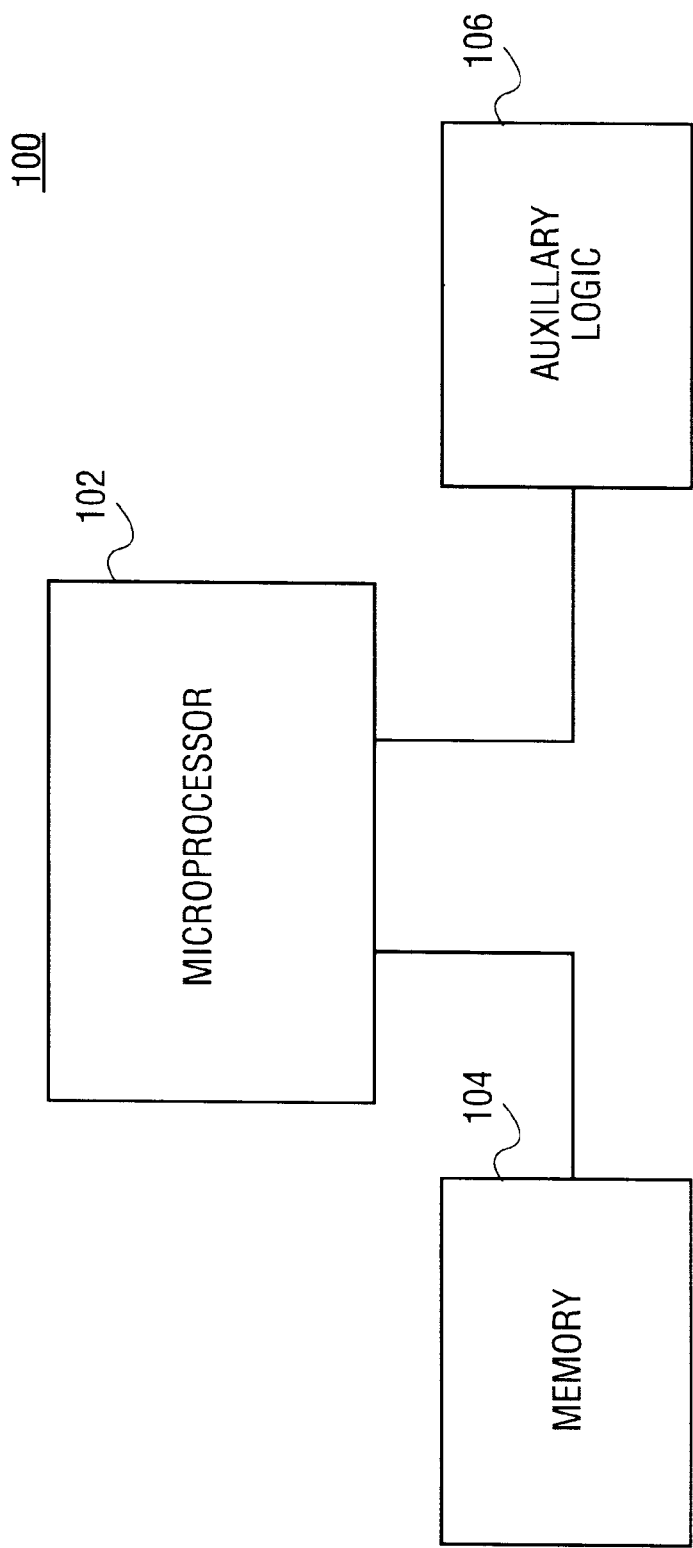
FIG. 1 is a block diagram of a computing environment suitable for implementing an embodiment of the invention.

FIG. 1 is a block diagram of an exemplar computing environment 100 suitable for implementing an embodiment of the invention. The computing environment 100 includes a microprocessor 102, a memory 104, and auxiliary logic 106.

The microprocessor 102 can be a processor of the Pentium® family available from Intel Corporation of Santa Clara, Calif. The microprocessor 102 performs its conventional functions of executing programming instructions, including implementing the teachings of the present invention. The memory 104 may be read-only-memory (ROM), random access memory (RAM), and/or other memory devices to temporarily or permanently store information. The auxiliary logic 106 include interfaces to display devices, sensors, communication devices, or other commonplace computing environment components.

Figure 2:
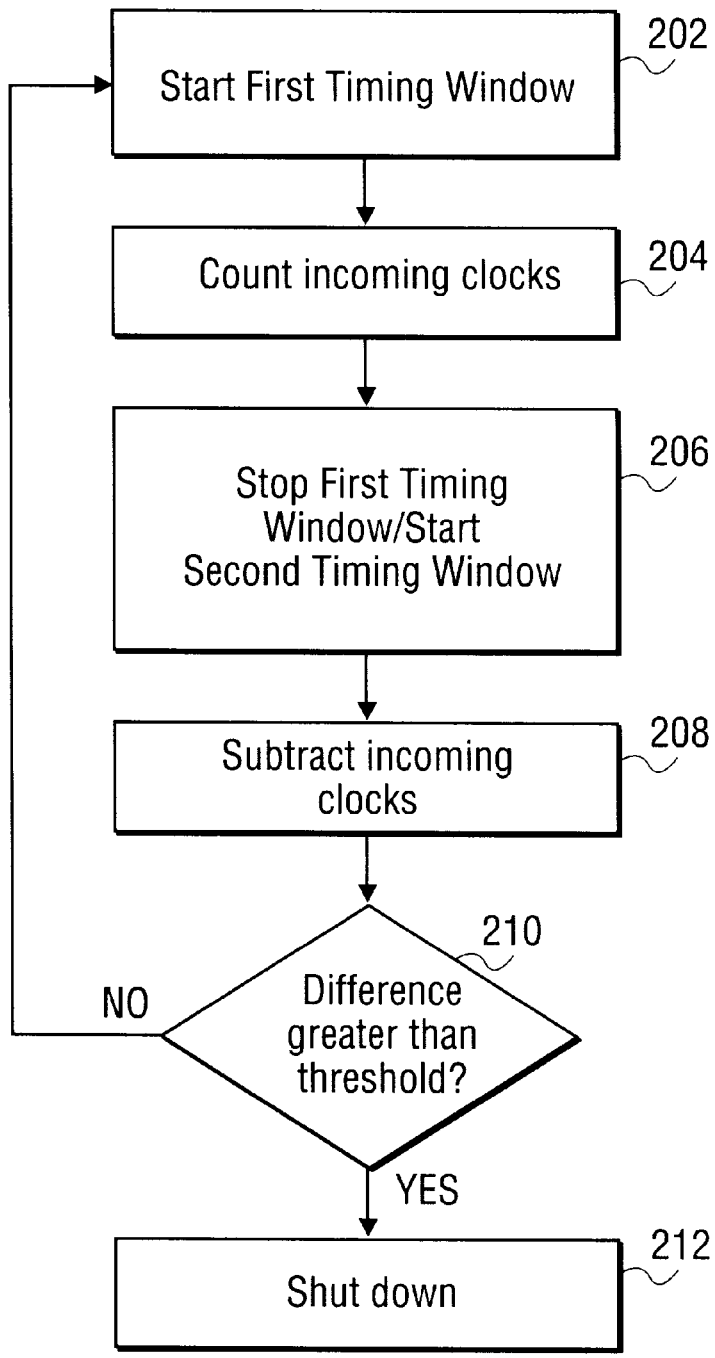
FIG. 2 depicts exemplar approach to implementing aspects of the invention in the computing environment depicted in FIG. 1.

FIG. 2 depicts a process 200 of an exemplar approach to implementing an aspect of the present invention in the computing environment 100. Step 202 starts a first timing window (or delay). Step 204 counts incoming clock signals applied during the first timing window. Step 206 stops the first timing window and starts a second timing window (or delay). Step 208 counts incoming clock signals applied during the second timing window and subtracts them from the incoming clock signals counted during the first timing window.

Step 210 determines whether the difference between the incoming clock signals applied during the second timing window and the incoming clock signals counted during the first timing window are greater than a threshold value. If the difference between the incoming clock signals applied during the second timing window and the incoming clock signals counted during the first timing window are greater than the threshold value, in step 212 the process 200 shuts down operations. If, on the other hand, the difference between the incoming clock signals applied during the second timing window and the incoming clock signals counted during the first timing window are less than the threshold value, the process 200 returns to step 202 and repeats itself.

Figure 3:
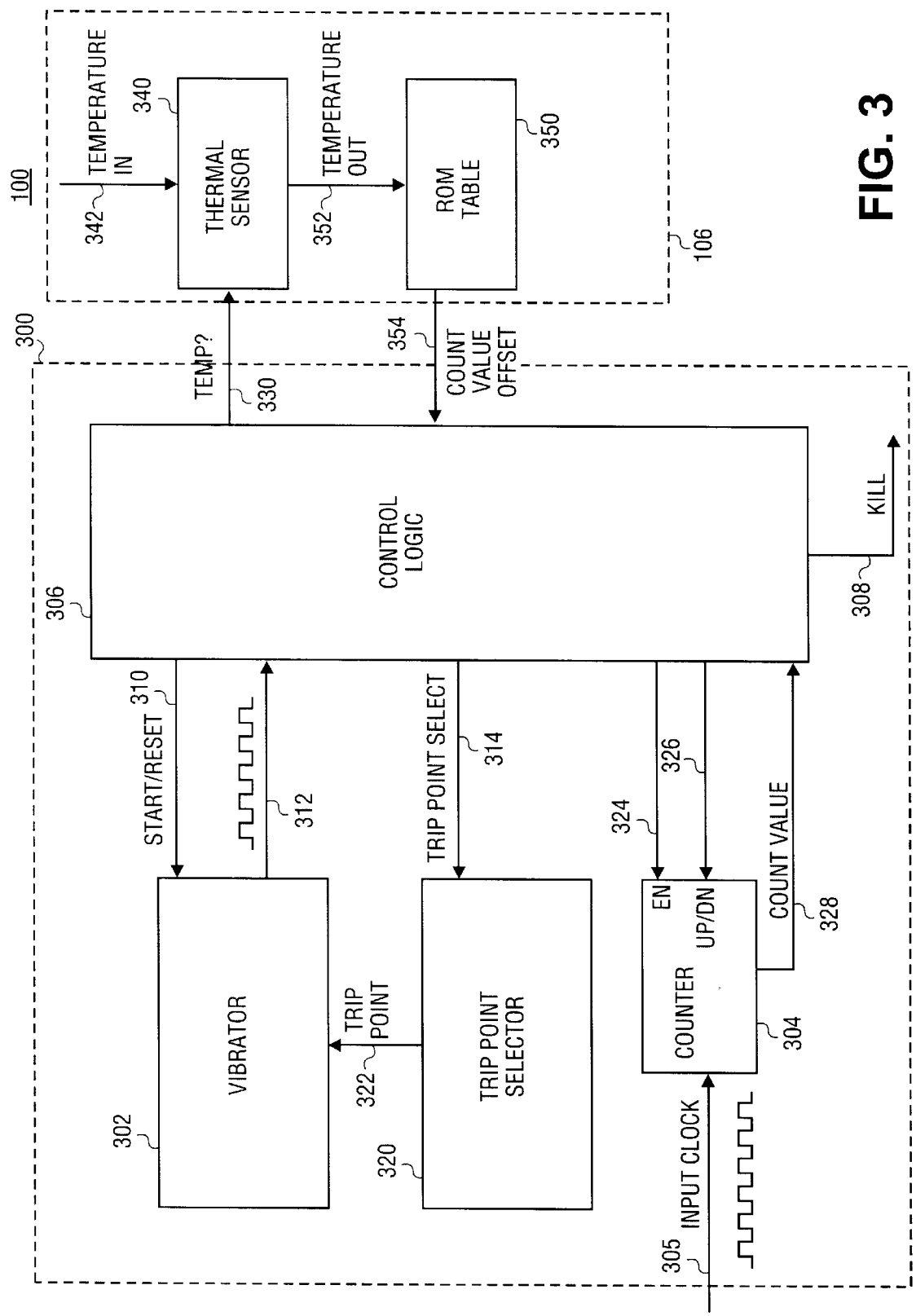
FIG. 3 is a block diagram of one embodiment of an exemplar timer according to aspects of the invention.

FIG. 3 is a block diagram depicting an exemplar timer 300 in the computing environment 100 with a portion of the auxiliary logic 106. In an embodiment, the timer 300 is a monolithic complementary metal oxide semiconductor (CMOS) timer. Typically, but not necessarily, the timer 300 is physically located on the microprocessor 102 (or on-die).

The exemplar timer 300 measures the frequency of a clock signal applied to a microprocessor to determine whether the microprocessor is being over clocked by the applied clock signal. When the frequency is sufficiently high, the timer 300 shuts down the microprocessor.

The exemplar timer 300 includes a vibrator 302, which generates timing windows. The vibrator 302 also generates delays. In one embodiment, the vibrator 302 generates two timing windows or two delays.

The timer 300 also includes a counter 304, which counts events. In an embodiment the counter 304 counts the number of clock signals in an input clock 305. Of course, the counter 304 can be any circuit or device that makes time based measurements during the timing windows. The lengths of the individual timing windows or delays are much longer than the period of the input clock 305.

The timer 300 also includes control logic 306, which starts the vibrator 302 oscillating, controls the amplitude of oscillations, counts the number of vibrator 302 oscillations, enables the counter 304, controls whether the counter 304 increments or decrements, and performs subtractions. The control logic 306 subtracts the number of clock signals or transitions on the input clock 305 during the delays and/or timing windows. Both the vibrator 302 and the counter 304 are coupled to control logic 306 to accomplish this.

The control logic 306 also issues a "kill" signal 308 when appropriate. If the frequency of the input clock 305 is sufficiently greater than a threshold value, the timer 300 shuts down or permits operation of the microprocessor, repectively, using the kill signal 308.

The control logic 306 starts the vibrator 302 oscillations by issuing a START/RESET signal 310. Once started, the vibrator 302 oscillates freely. The vibrator 302 outputs oscillations 312 to the control logic 306.

The control logic 306 controls the amplitude of oscillations by issuing a trip point select command 314 to a trip point selector 320. The trip point selector 320 selects trip points and sends them to the vibrator 302 as the trip point signal 322. The trip points determine the vibrator 302 oscillation amplitudes.

The control logic 306 enables the counter 304 by issuing an EN command 324 to the counter 304, which clears the counter 304 and loads it with all zeros. The control logic 306 controls whether the counter 304 increments or decrements by issuing an UP/DN command 326 to the counter 304.

The counter 304 is coupled to send a count value 328 to the control logic 306. When the control logic 306 performs subtractions, the control logic 306 subtracts the count value 328 obtained during the second window or second delay from the count value 328 obtained during the first window or first delay. Alternatively, the control logic 306 subtracts the count value 328 obtained during the first window or first delay from the count value 328 obtained during the second window or second delay. Thus, for each signal of the input clock 305, the counter 304 outputs a count as the count value signal 328.

Alternatively, the counter 304 increments and decrements under the control of the control logic 306 at the rate of the input clock 305. In this case, the count value 328 is effectively a subtraction of incoming clock signals counted during the second timing window or second delay from the incoming clock signals counted during the first timing window or first delay.

The control logic 306 also issues a Temp? command 330 to a thermal sensor 340 to request that the thermal sensor 340 measure junction temperature. Voltage and current characteristics of integrated circuits, such as those found in the computing environment 100, typically change as the junction temperature changes. Junction temperature within a microprocessor can change as a result of changes in ambient temperature as well as power consumption of the microprocessor itself. The thermal sensor 340 senses junction temperature via a temperature in signal 342 using any of a number of well-known integrated circuit temperature sensing techniques. The output of the thermal sensor 340 is a temperature out signal 352, which is coupled to the ROM table 350.

The ROM table 350 stores a list of expected count value s for various temperatures in the range of operation. The list represents a number of clock counts associated with particular temperatures. The ROM table 350 reads the temperature out signal 352, looks up the number of clock counts associated with the particular temperature, and issues a count value 354 to the control logic 306. In total, the circuitry represented by the auxiliary logic 106 includes the thermal sensor 340 and the ROM table 350.

The count value 354 is coupled to the control logic 306. The control logic 306 uses the count value 354 to take temperature into account when making a determination of the threshold value. The threshold value is used to determine whether to cease or continue microprocessor operations.

Figure 4A:
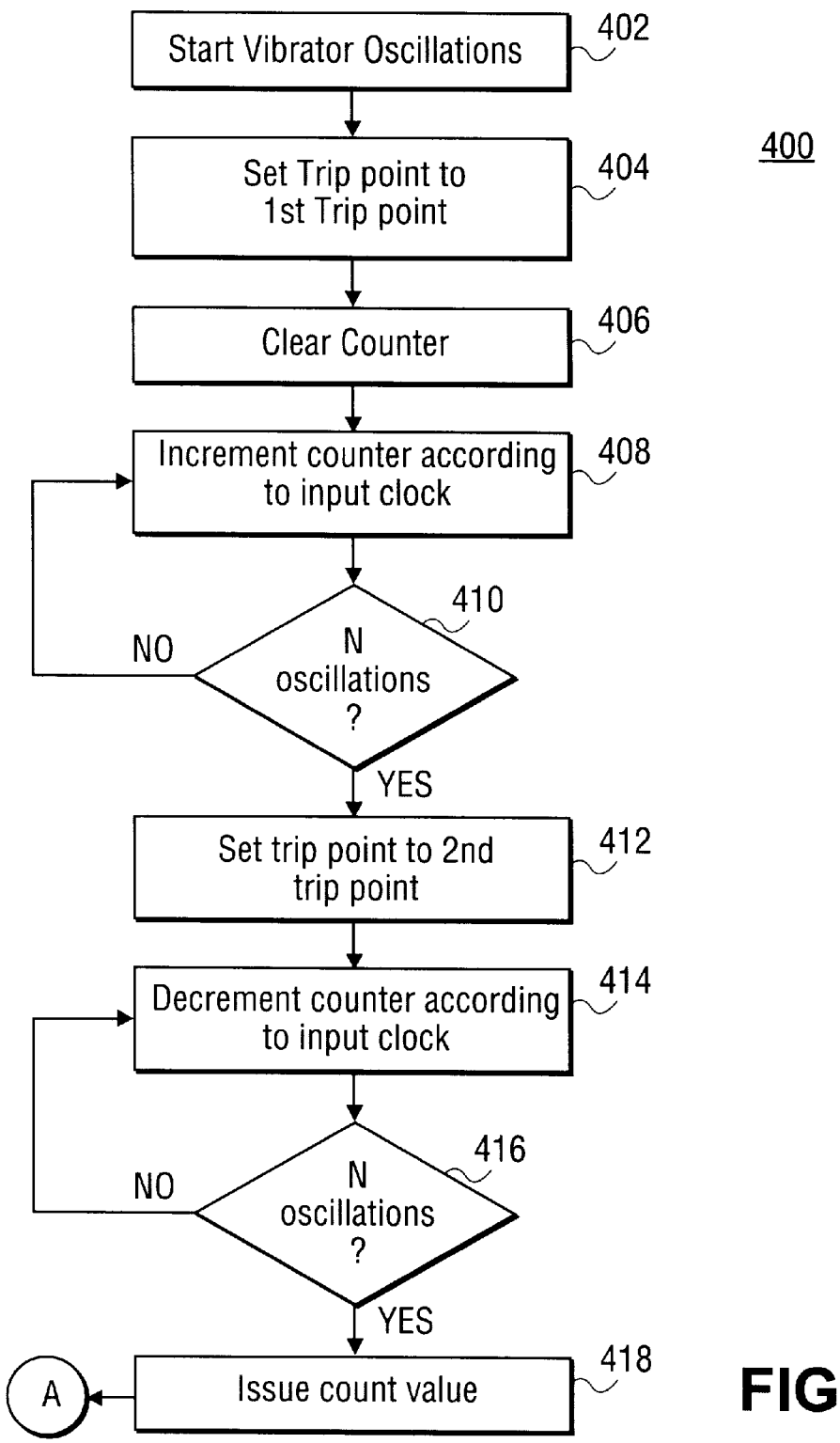
FIGS. 4A and 4B depict an exemplar approach to implementing the exemplar timer depicted in FIG. 3.
Figure 4B:
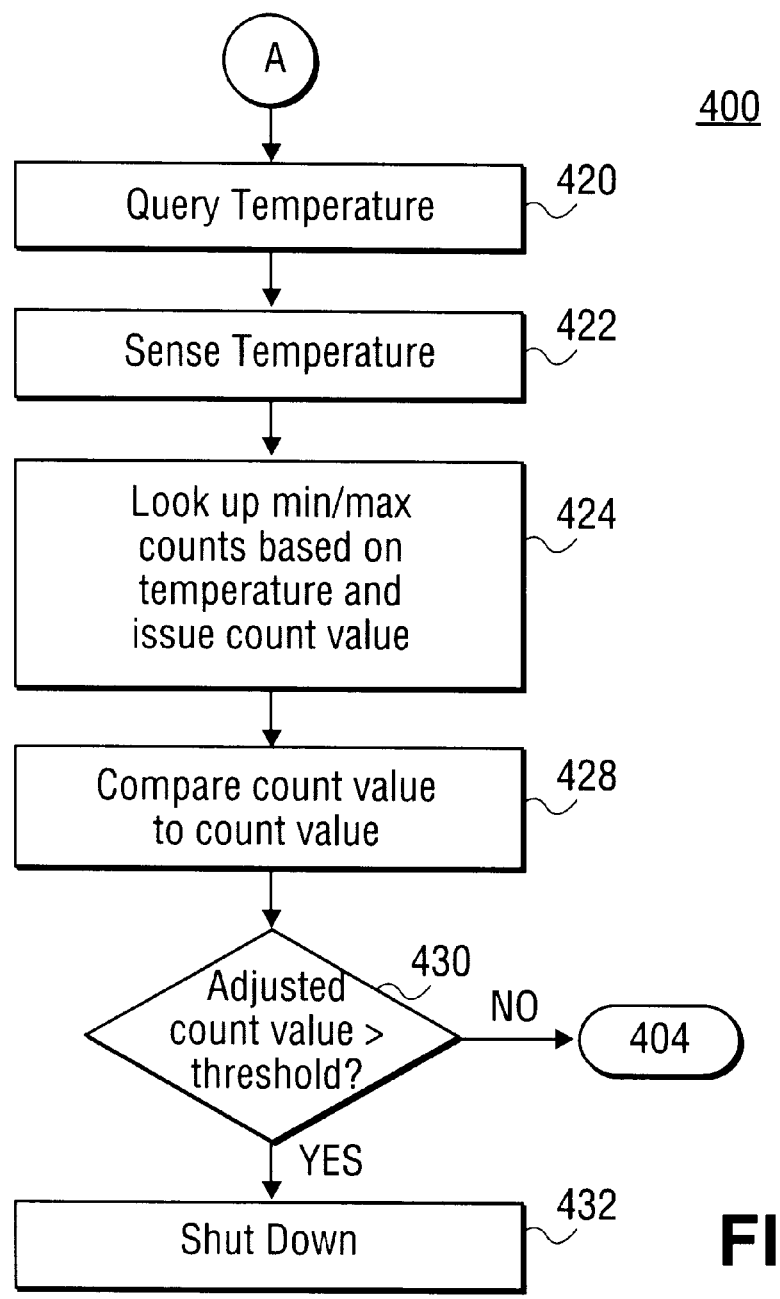
Figure 6A:
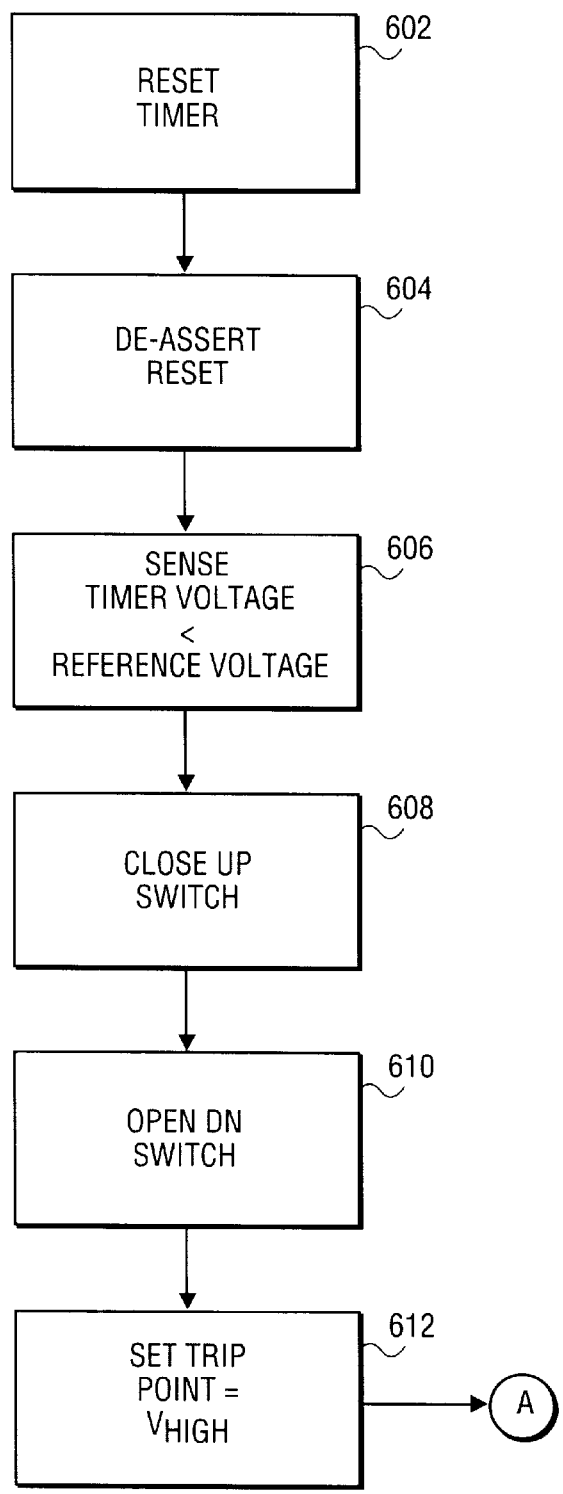
FIGS. 6A, 6B, and 6C illustrate an exemplar process executed by the timer depicted in FIG. 5.
Figure 6B:
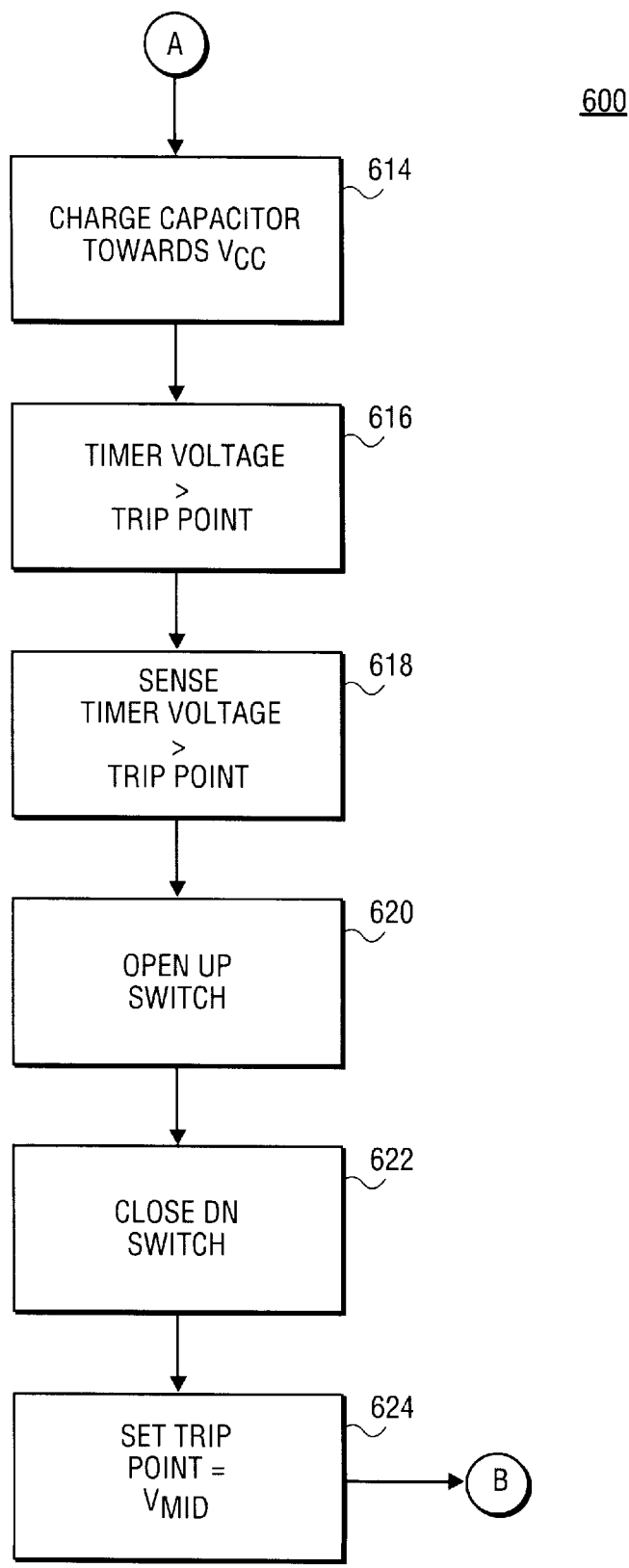
Figure 6C:
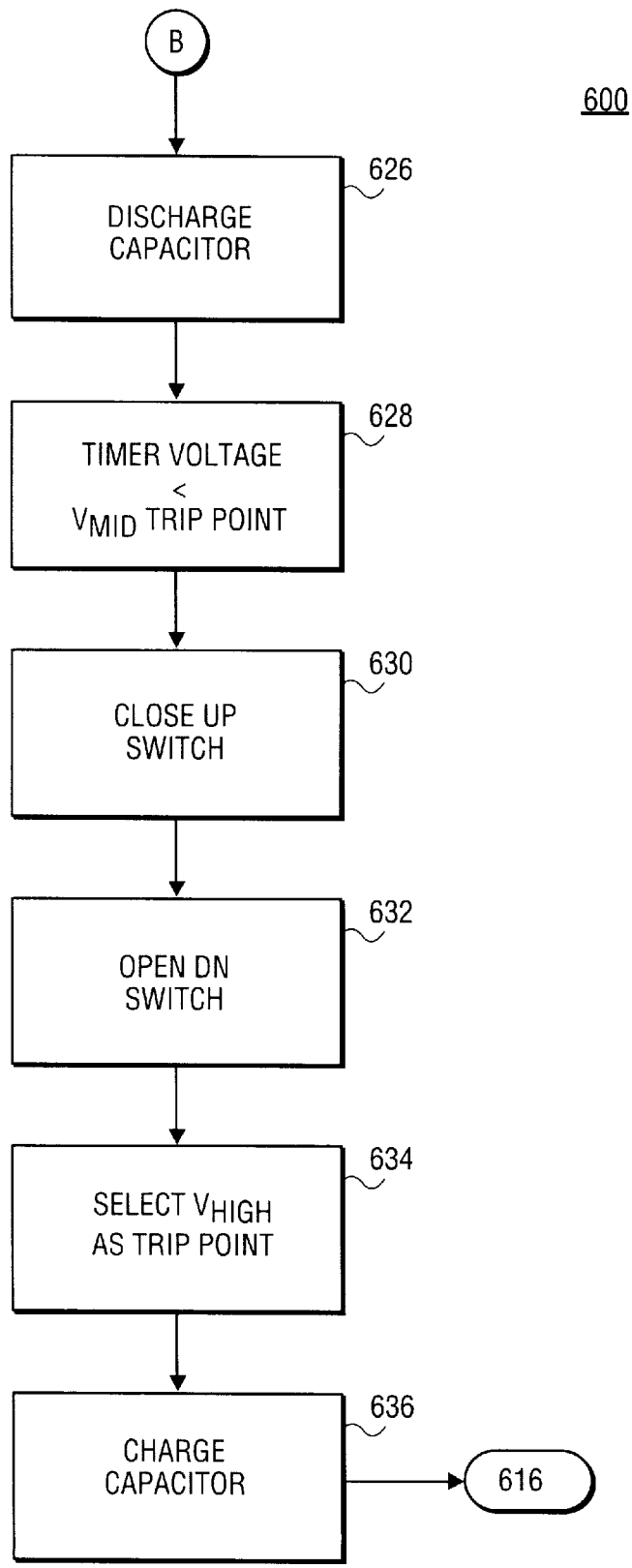

FIGS. 4A and 4B depict a process 400 of an exemplar approach to implementing the timer 300. Step 402 starts the vibrator 302. Step 404 sets the first trip point. Step 406 clears the counter 304. Step 408 increments the counter 304 according to the input clock 305. Step 410 determines whether the vibrator 302 has oscillated for a predetermined number of times. How the appropriate number of oscillations is determined is described in greater detail with reference to FIGS. 5, 6A, 6B, and 6C below.

If the vibrator 302 has not oscillated for the predetermined number of times, the process 400 returns to step 408 and the counter 304 continues to increment. If, on the other hand, the vibrator 302 has oscillated for a predetermined number of times, the process 400 passes to step 412 and the control logic 306 resets the vibrator 302 oscillation by issuing the START/RESET command 310. Operation continues accordingly.

Step 412 sets the second trip point. Step 414 decrements the counter 304 according to the input clock 305. Step 416 determines whether the vibrator 302 has oscillated for a predetermined number of times.

If the vibrator 302 has not oscillated for the predetermined number of times, the process 400 returns to step 414 and the counter 304 continues to decrement. If, on the other hand, the vibrator 302 has oscillated for a predetermined number of times, the process 400 passes to step 418. Step 418 issues a count value. Step 420 queries the ambient temperature. Step 422 senses the ambient temperature. Step 424 looks up a count value based on the temperature in the ROM table 350 and issues a count value associated with the temperature. Step 428 compares the count value 354 to the count value 328. Step 430 determines whether the count value 328 adjusted by or compared to the count value 354 exceeds the threshold value.

If the count value 328 adjusted by the count value 354 exceeds the threshold value, control of the process 400 passes to step 432. Step 432 shuts down operation. The control logic 306 issues the KILL command 308. If the count value 328 adjusted by the count value 354 does not exceed the threshold value, control of the process 400 returns to step 404. The control logic 306 resets the vibrator 302 oscillation by issuing the START/RESET signal 310 and operation continues accordingly.

FIG. 5 is a schematic diagram of the timer 300 in more detail. According to the example, the timer 300 has two current sources 502 and 504, which are connected to a capacitor 506 by an UP switch 508 and a DN switch 510. The timer 300 is coupled between a supply voltage $V_{CC}$ 514 and a source voltage $V_{SS}$ 516.

There are many possible implementations of the current sources 502 and 504 and the UP and DN switches 508 and 510. The UP and DN switches 508 and 510 are mutually exclusive—either the UP switch 508 is closed or the DN switch 510 is closed. Accordingly, a timer voltage 512 on the timer capacitor 506 will charge towards the supply voltage $V_{CC}$ 514 or discharge towards the source voltage $V_{SS}$ 516, respectively.

The timer voltage 512 connects to one input of a comparator 520. The other input of the comparator 520 is connected to two multiplexers 522 and 524. The two multiplexers 522 and 524 multiplex three reference voltages 530, 532, and 534. The reference voltages 530, 532, and 534 are developed by a current source 536 and three resistances 540, 542, and 544, respectively. For ease of understanding, the reference voltages 530, 532, and 534 can be thought of as $V_{HIGH}$, $V_{MID}$, and $V_{LOW}$, respectively, where $V_{HIGH} > V_{MID} > V_{LOW}$.

The comparator 520's output asserts an UP signal 521, which causes the UP switch 508 to open or close, and a DN signal 523, which causes the DN switch 523 to open or close. An inverter 525 ensures that the UP switch 508 and the DN switch 510 are not closed at the same time.

The comparator 520's output also enters a 1/N divider 528, or equivalent logic, which counts a fixed number of transitions of the comparator 520 output. In one embodiment, N=4. When the 1/N divider 528 counts four transitions 1/N divider 528 asserts the EN signal 324.

The comparator 520 output drives the DN switch 510 and is inverted to drive the UP switch 508. The comparator 520 output also selects between the reference voltage 534 and one of the other two reference voltages 532 and 530 as the comparator 520's input. The trip point select signal 314 selects from between the reference voltages 530 and 532 to determine which of the two reference voltages are to be the comparator 520's input.

The counter 304 is enabled by the EN signal 324 output of the 1/N divdier 528 and is used to calculate the frequency of the input clock 305 by counting the number of clocks within a timer window or during a delay. In one embodiment, the counter 304 increments when the reference voltage 530 is selected and decrements when the reference voltage 532 is selected. Alternatively, the counter 304 decrements when the reference voltage 530 is selected and increments when the reference voltage 532 is selected. As described above, the UP/DN signal 326 controls whether the counter 304 increments or decrements.

The timer 300 of FIG. 5 operates according to the process 600 illustrated in FIG. 6. In step 602, the START/RESET signal 310 is asserted and the timer 300 is reset. During timer 300 reset the capacitor 506 is discharged to the source voltage $V_{SS}$ 516 by a pull down device 580. The START/RESET signal 310 closes the pull down device 580 and discharges the capacitor 506 throught the pull down device 580. The START/RESET signal 310 also ensures that the UP switch 508 is open and the DN switch 504 is closed.

In step 604, the START/RESET signal 310 is de-asserted. When the START/RESET signal 310 is de-asserted the comparator 520 senses that the timer voltage 512 is less than the reference voltages 530, 532, and 534, as indicated by step 606. The comparator 520 asserts the UP signal 521, which causes the UP switch 508 to close, step 608, and de-asserts the signal on the DN signal 523, which causes the DN switch 510 to open, step 610. In step 612, the trip point select signal 314 selects the reference voltage 530 ($V_{HIGH}$) as the comparator 520 trip point. In step 614, the capacitor 506 charges and ramps up towards the supply voltage $V_{CC}$ 514.

In step 616, the timer voltage 512 crosses the reference voltage 530 ($V_{HIGH}$) trip point. In step 618, the comparator 520 senses that the timer voltage 512 is greater than the reference voltage 530 ($V_{HIGH}$) trip point. The comparator 520 de-asserts the UP signal 521, which causes the UP switch 508 to open, step 620, and asserts the signal on the DN signal 523, which causes the DN switch 510 to close, step 622. In step 624, the trip point select signal 314 selects the reference voltage 532 ($V_{MID}$) as the comparator 520 trip point. In step 624, the capacitor 506 reverses direction and ramps down towards the source voltage $V_{SS}$ 516.

In step 628, the timer voltage 512 crosses the reference voltage 534 ($V_{LOW}$) trip point. The comparator 520 asserts the UP signal 521, which causes the UP switch 508 to close, step 630, and de-asserts the signal on the DN signal 523, which causes the DN switch 510 to open, step 632. In step 634, the trip point select signal 314 selects the reference voltage 530 ($V_{HIGH}$) as the comparator 520 trip point. In step 636, the capacitor 506 charges and ramps up towards the supply voltage $V_{CC}$ 514.

Using the process 600, multiple capacitor ramps can be used in the timer 300 and any error accumulated is cancelled by the subtraction process. The result is greater precision in determining the frequency of the applied clock signal, and consequently, greater precision in determining whether to shut down a microprocessor due to over clocking. Moreover, the timer 300 allows on-die reference times of larger duration than those that can be accomplished practically with a single resistor-capacitor ramp. A larger duration reference is advantageous because it reduces error due to quantization (or sampling) of the timer reference by the input clock 305.

Although the process 600 begins with the trip point select signal 314 selecting the reference voltage 530 ($V_{HIGH}$) as the comparator 520 trip point, the process 600 may begin with the trip point select signal 314 selecting the reference voltage 532 ($V_{MID}$) as the comparator 520 trip point. Using the description herein, persons of ordinary skill in the relevant art would readily realize how to implement this alternative. The process 600 continues indefinitely, resulting in a triangular waveform (for an ideal capacitor), which is discussed in greater detail below with reference to FIGS. 7 and 8.

Figure 7:
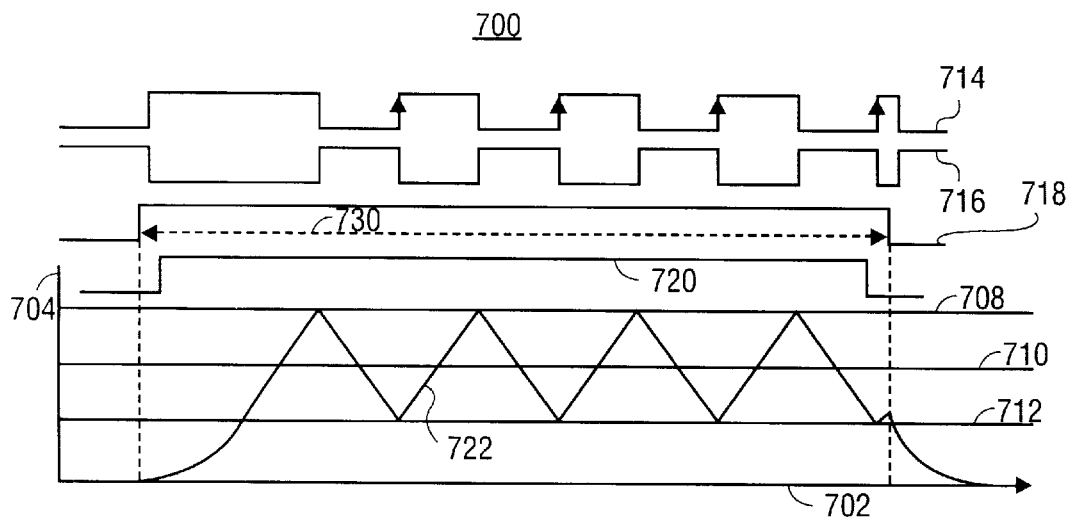
FIG. 7 is a graphical representation of an analysis of the high amplitude portion of the process depicted in FIG. 6.

FIG. 7 is a graphical representation 700 of an embodiment where the high amplitude portion of the process 600 is shown and N=4 for the 1/N divider 528. Of course, the invention is not limited to N=4. Rather, N can be any appropriate integer. The graphical representation 700 shows the case where the trip point select signal 314 selects the reference voltage 530 ($V_{HIGH}$) as the comparator 520 trip point. An x-axis 702 represents time and a y-axis 704 represents voltage.

A level 708 represents the reference voltage 530 ($V_{HIGH}$). A level 710 represents the reference voltage 532 ($V_{MID}$). A level 712 represents the reference voltage 534 ($V_{LOW}$). A waveform 714 and a waveform 716 represent the UP signal 521 and the DN signal 523, respectively. A waveform 718 represents the START/RESET signal 310.

A waveform 720 represents the EN signal 324, which enables the counter 304 to count the input clock 305. The counter 304 counts up or down according to the state of the trip point select signal 314.

The waveform 722 represents the timer voltage 512, which ramps up from the source voltage $V_{SS}$ 516 to the reference voltage 530 ($V_{HIGH}$) and then oscillates between the reference voltage 530 ($V_{HIGH}$) and the reference voltage 534 ($V_{LOW}$) four times. The length of the waveform 722 is a timing window (or delay) 730 (the $V_{HIGH}$ timing window/delay). The counter 304 counts the input clock 305 during the $V_{HIGH}$ timing window/delay 730.

Figure 8:
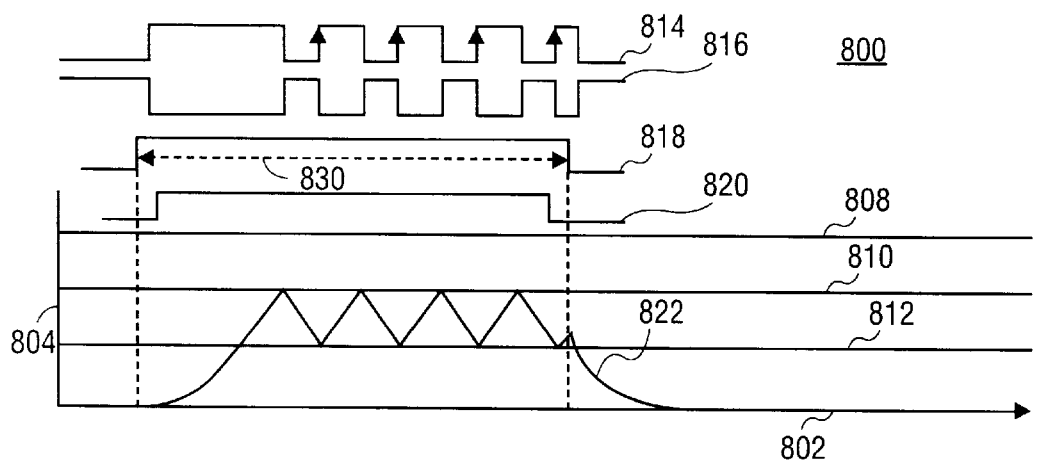
FIG. 8 is a graphical representation of an analysis of the low amplitude portion of the process depicted in FIG. 6.

FIG. 8 is a graphical representation 800 where the low amplitude portion of the process 600 is shown. In this context, the "low amplitude" refers to the reference voltage 532 ($V_{MID}$) rather than to the reference voltage 534 ($V_{LOW}$). The 1/N divider 528 is still set to N=4, but the trip point select signal 314 selects the reference voltage 532 ($V_{MID}$) as the comparator 520 trip point. The function of the timer 300 in generating the graphical representation 800 is the same as the function of the timer 300 in generating the graphical representation 700, except that the lower trip point in the graphical representation 800 results in a higher frequency of oscillation.

An x-axis 802 represents time and a y-axis 804 represents voltage. A level 808 represents the reference voltage 534 ($V_{HIGH}$). A level 810 represents the reference voltage 532 ($V_{MID}$). A level 812 represents the reference voltage 534 ($V_{LOW}$). A waveform 814 and a waveform 816 represent the UP signal 521 and the DN signal 523, respectively. A waveform 818 represents the START/RESET signal 310.

A waveform 820 represents the EN signal 324, which enables the counter 304 to count the input clock 305. The counter 304 counts up or down according to the state of the trip point select signal 314.

The waveform 822 represents the timer voltage 512, which ramps up from the source voltage $V_{SS}$ 516 to the reference voltage 532 ($V_{MID}$), and then oscillates between the reference voltage 532 ($V_{MID}$) and the reference voltage 534 ($V_{LOW}$) four times. The length of the waveform 822 is a timing window (or delay) 830 (the $V_{MID}$ timing window/delay). The counter 304 counts the input clock 305 during the $V_{MID}$ timing window/delay 830.

Note that the length of the $V_{MID}$ timing window/delay is shorter than the the $V_{HIGH}$ timing window/delay. This is because the timing windows/delays are based on how long it takes for the capacitor 506 to ramp up and down. The time it takes for the capacitor 506 to ramp up and down between the reference voltage 532 ($V_{MID}$) and the reference voltage 534 ($V_{LOW}$) is shorter than the time it takes for the capacitor 506 to ramp up and down between the reference voltage 530 ($V_{HIGH}$) and the reference voltage 534 ($V_{LOW}$).

Figure 9:
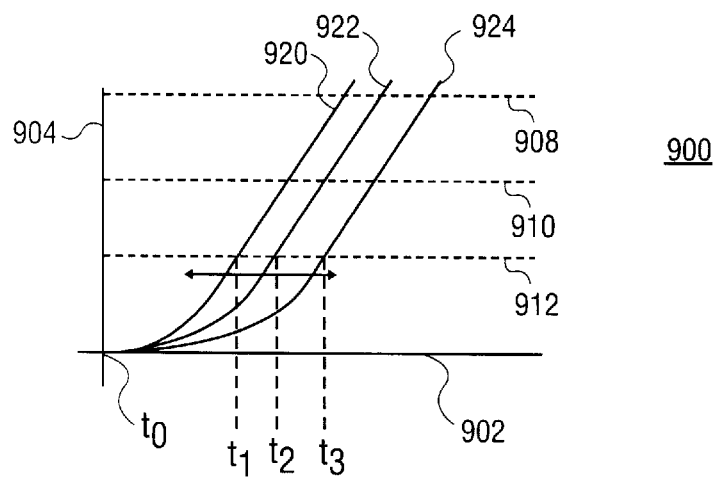
FIG. 9 is a graphical representation showing capacitor variation across maufacturing processes.

FIG. 9 is a graphical representation 900 showing variation across maufacturing processes that a capacitor implemented by the capacitor 506 can experience. An x-axis 902 represents time and a y-axis 904 represents voltage across the capacitor 506, which is the timer voltage 512. Three levels 908, 910, and 912 represent the reference voltages 530, 532 and 534 ($V_{HIGH}$, $V_{MID}$, and $V_{LOW}$) respectivley, for the timer voltage 512. Three characteristic curves 920, 922, and 924 represent the operational characteristics of three separate capacitors manufactured during three separate processes.

For purposes of explanation, assume that we begin to charge (or ramp up) the capacitors at the same time ($t_0$). Because the capacitors vary across process the voltage on the capacitor with the characteristic curve 920 reaches the level 912 at a time $t_1$, the voltage on the capacitor with the characteristic curve 922 reaches the level 912 at a time $t_2$, and voltage on the capacitor with the characteristic curve 924 reaches the level 912 at a time $t_3$. That is, there is a time delay in reaching a particular voltage level based on the particular capacitor. Note that during ramp up from the level 910 to the level 908, the capacitor operation is linear. Thus, only the capacitor 506 linear region when ramping up from the level 910 to the level 908 contributes to the net effective delay.

Although in FIG. 9 there are three separate curves 920, 922, and 924 representing three separate capacitors, it is to be understood that when only one capacitor is used that does not vary across manufacturing process there is only one characteristic curve for the capacitor. In this case, the design accomodates a capacitor with an unknown characteristic curve.

Figure 10:
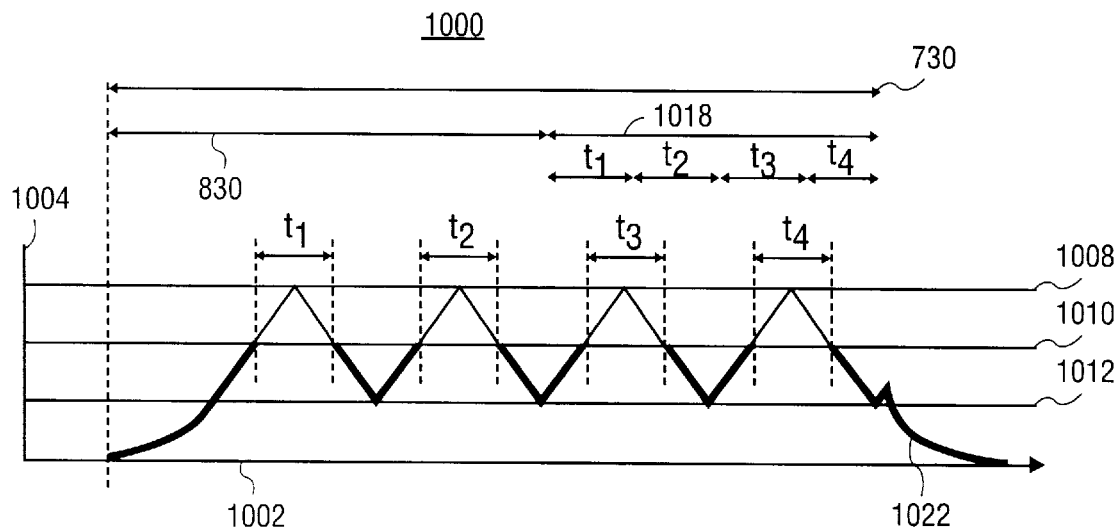
FIG. 10 is a graphical representation showing subtraction.

FIG. 10 is a graphical representation 1000 that illustrates the subtration process of one embodiment of the present invention. An x-axis 1002 represents time and a y-axis 1004 represents voltage across the capacitor 506, which is the timer voltage 512. A level 1008 represents the reference voltage 530 ($V_{HIGH}$). A level 1010 represents the reference voltage 532 ($V_{MID}$). A level 1012 represents the reference voltage 530 ($V_{LOW}$). The graphical representation 1000 shows the $V_{HIGH}$ timing window/delay 730, the $V_{MID}$ timing window/delay 830, and a timing window/delay 1018.

In the graphical representation 1000, the low amplitude waveform 822 is fractured and superimposed onto the high amplitude waveform 722 to generate a waveform 1022. Recall that only the capacitor 506's linear region when ramping up from the level 910 to the level 908 contributes to the net effective delay error for the capacitor 506. If the $V_{MID}$ timing window/delay 830 is subtracted from the $V_{HIGH}$ timing window/delay 730, the difference is equal to the capacitor 506 delay from to the portion of the waveform 722 above the region where the camparator 520 trip point is equal to the reference voltage 532 ($V_{MID}$). Since capacitor non-linearity is most sensative to process variation when bias voltage is low, this technique allows the delay error to be dependent only on regions where the capacitor 506 is linear and/or less sensitive to process variation.

As FIG. 10 illustrates, this embodiment of the timer 300 uses only the portions of the waveforms generated during the times $t_1$, $t_2$, $t_3$, and $t_4$. This embodiment of the timer 300 effectively eliminates the delay error during $t<t_1$, $t>t_1<t_2$, $t>t_2<t_3$, $t>t_3<t_4$, and $t>t_4$, which are during ramp up from fully discharged to the reference voltage 532 ($V_{MID}$). Because the waveforms 722 and 822 are identical in the linear regions, when their delays are subtracted, the contribution of delay error in the linear region is eliminated, and along with it the process sensitivity. This is particularly useful in eliminating the delay error in capacitors where there are large unacceptable variations in delay across, such as accumulation mode MOS capacitors.

Figure 11:
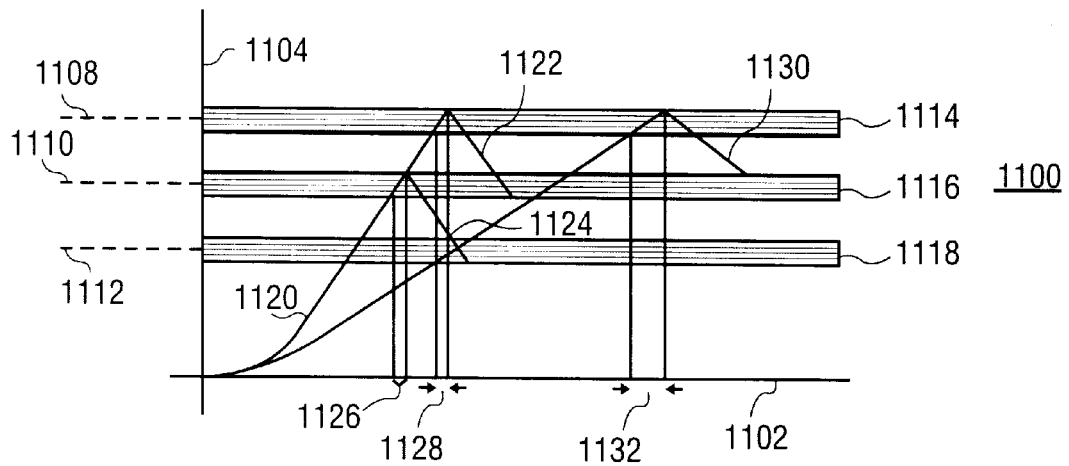
FIG. 11 is a graphical representation showing delay error due to comparator offset voltage and noise.

FIG. 11 is a graphical representation 1100 that illustrates how one embodiment of the timer 300 overcomes delay error due to the comparator 520's offset voltage and noise. An x-axis 1102 represents time and a y-axis 1104 represents voltage across the capacitor 506, which is the timer voltage 512. A level 1108 represents the reference voltage 530 ($V_{HIGH}$). A level 1110 represents the reference voltage 532 ($V_{MID}$). A level 1112 represents the reference voltage 534 ($V_{LOW}$). The gray bars 1114, 1116, and 1118 represent a range of possible comparator 520 trip points surrounding the levels 1108, 1110, and 1112, respectively. Two waveforms 1120 and 1130 represent a capacitor with a fast ramp rate and a capacitor with a slow ramp rate, respectively. The waveform 1120 has two portions, a portion 1122 where the comparator 520 trip point is the reference voltage 534 ($V_{HIGH}$) and a portion 1124 where the comparator 520 trip point is the reference voltage 532 ($V_{MID}$).

Three regions 1126, 1128, and 1132 represent the usable area of the portions 1124 and 1122, and the waveform 1130, respectively, and show that the delay error caused by variations in the comparator 520's offset voltage is proportional to the capacitor 506's ramp rate. For a given timer duration, no additional error is accumulated because of offset voltage when comparing a single slow ramp to multiple fast ramps. Furthermore, if the capacitor 506 is linear, the delay error caused by comparator offset voltage is eliminated when subtracting the high amplitude delay from the low amplitude delay.

In an alternative embodiment, the timer 300 includes an option to chop the comparator 520 if desired to cancel offset voltage effects.

Figure 12:
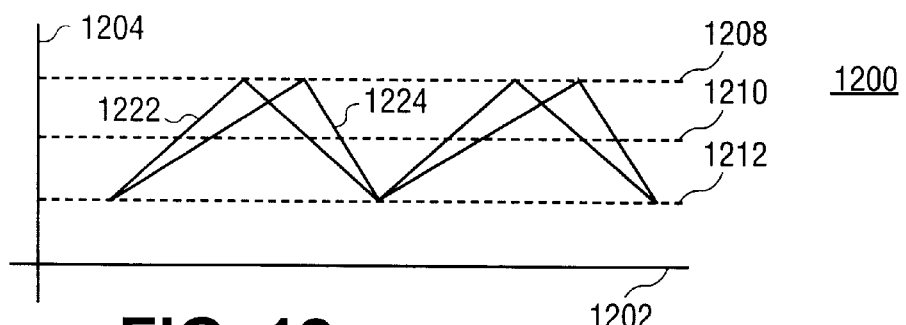
FIG. 12 is a graphical representation showing delay error due to capacitor leakage.

FIG. 12 is a graphical representation 1200 that illustrates how one embodiment of the timer 300 overcomes delay error due to the leakage in the capacitor 506. An x-axis 1202 represents time and a y-axis 1204 represents voltage across the capacitor 506, which is the timer voltage 512. A level 1208 represents the reference voltage 530 ($V_{HIGH}$). A level 1210 represents the reference voltage 532 ($V_{MID}$). A level 1212 represents the reference voltage 534 ($V_{LOW}$). Two waveforms 1222 and 1224 represent the timer voltage 512 for an ideal capacitor 506 and a non-ideal capacitor 506, repectively. The difference between the timer voltages for the two waveforms 1222 and 1224 is due to leakage current in the non-ideal capacitor 506. For a single ramp solution, the non-ideal capacitor leakage current is a direct source contributing to delay error. Because one embodiment of the timer 300 ramps the capacitor 506 in both directions, delay error caused by leakage current is eliminated during the subtraction process.

Figure 13:
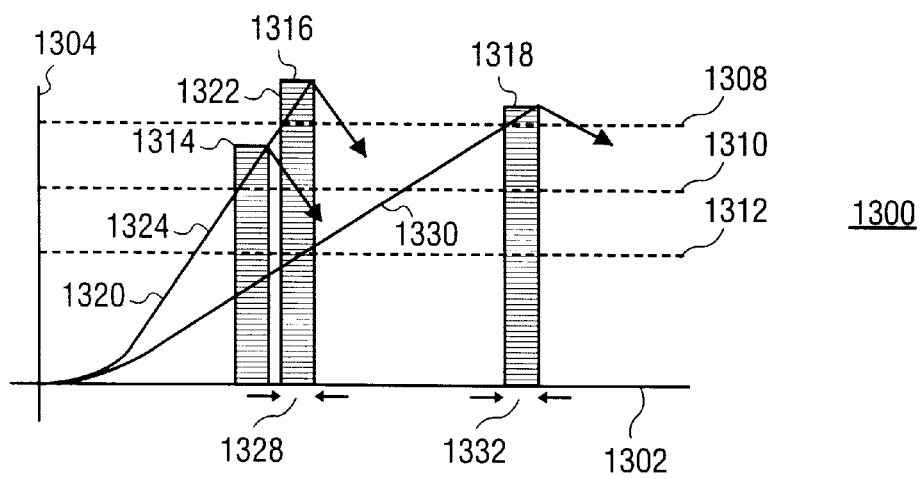
FIG. 13 is a graphical representation showing delay error due to comparator delay.

FIG. 13 is a graphical representation 1300 that illustrates how one embodiment of the timer 300 overcomes the accumulation of delay error due to the comparator 520's transition time. An x-axis 1302 represents time and a y-axis 1304 represents voltage across the capacitor 506, which is the timer voltage 512. A level 1308 represents the reference voltage 530 ($V_{HIGH}$). A level 1310 represents the reference voltage 532 ($V_{MID}$). A level 1312 represents the reference voltage 534 ($V_{LOW}$). The gray bars 1314, 1316, and 1318 represent accumulations of comparator 520 delay errors. Two waveforms 1320 and 1322 represent a capacitor with a fast ramp rate and a capacitor with a slow ramp rate, respectively. The waveform 1320 has two portions, a portion 1322 where the comparator 520 error accumulation is associated with the reference voltage 530 ($V_{HIGH}$) and a portion 1324 where the comparator 520 error accumulation is associated with the reference voltage 532 ($V_{MID}$).

The graphical representation 1300 shows that because there is non-zero propagation delay after the input to the comparator 502 crosses the trip point, and this delay can vary across process, accumulation of many of these delays would result in a loss of precision. Because the high amplitude and low amplitude waveforms 722 and 822, respectively, have the same number of transitions, however, the comparator 520 propagation delay is eliminated in the subtraction process. This holds true when the comparator 520 is designed such that the propagation delay does not vary significantly from the reference voltage 530 ($V_{HIGH}$) to the reference voltage 532 ($V_{MID}$).

Various embodiments of the invention have been described with reference to over clocking a microprocessor. It is to be understood, however, that aspects of the invention apply to under clocking a microprocessor as well. Moreover, from the description provided herein, a person of ordinary skill in the relevant arts would readily realize how to implement these aspects.

Aspects of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
    circuitry to generate a first timing window and a second timing window;
    a counter to count clock cycles of a clock signal during the first and second timing windows;
    logic coupled to the circuitry and the counter to determine a delay between the first and second timing windows and to determine whether clock signal's frequency exceeds a threshold frequency based on the delay;

a comparator to compare a device's level to a first level during the first timing window and to compare the device's level to a second level different from the first level during the second timing window; and logic coupled to an output of the comparator and to the counter to determine when to begin and end the first and second timing windows.

2. The apparatus of claim 1, further comprising a sensor to sense the ambient temperature or junction temperature.

3. The apparatus of claim 1, further comprising:

a memory to store a set of values; and logic to cause the apparatus to cease operations if the delay exceeds a predetermined value.

4. The apparatus of claim 1, wherein the logic is further to subtract the clock cycles counted during the second timing window from the clock cycles counted during the first timing window to cancel timing window error.

5. An apparatus comprising:

circuitry to generate a first timing window and a second timing window, the circuitry including:

a capacitor having a capacitor voltage;

first multiplexer coupled to the counter to select between a first reference voltage and a second reference voltage and to output a first multiplexer reference voltage; and second multiplexer coupled to the first multiplexer to select between the first multiplexer reference voltage and a third reference voltage and to output a second multiplexer reference voltage;

first switch coupled to the capacitor and the second multiplexer to close if the capacitor voltage is less than the second multiplexer reference voltage and to open if the capacitor voltage is greater than or equal to the second multiplexer reference voltage; and second switch coupled to the capacitor and the second multiplexer to close if the capacitor voltage is greater than or equal to the second multiplexer reference voltage and to open if the capacitor voltage is less than the second multiplexer reference voltage;

a counter to count clock cycles during the first and second timing windows; and logic coupled to the circuitry and the counter to cancel timing window error.

6. The apparatus of claim 5, further comprising a reference current source coupled to a supply voltage to generate a reference current in first, second, and third resistors, and coupled to a source voltage, to develop the first, second and third multiplexer reference voltages.

7. The apparatus of claim 5, further comprising a select signal coupled to the counter to cause the counter to increment during the first timing window and to decrement during the second timing window and coupled to the first multiplexer to cause the first multiplexer to select either the first multiplexer reference voltage or the second multiplexer reference voltage.

8. The apparatus of claim 5, further comprising logic coupled to first and second switches to cancel timing window error due to capacitor process sensitivity.

9. The apparatus of claim 5, further comprising logic coupled to first and second switches to cancel timing window error due to capacitor offset voltage.

10. The apparatus of claim 5, further comprising logic coupled to first and second switches to cancel timing window error due to capacitor noise.

11. The apparatus of claim 5, further comprising logic coupled to first and second switches to cancel timing window error due to capacitor leakage.

12. The apparatus of claim 5, further comprising two current sources coupled to the capacitor to develop the capacitor voltage.

13. The apparatus of claim 12, further comprising a comparator coupled to the capacitor and the second multiplexer to compare the capacitor voltage to the second multiplexer reference voltage and to output a first comparator signal to close the first switch if the capacitor voltage is less than the second multiplexer reference voltage and a second comparator signal to close the second switch if the capacitor voltage is greater than or equal to the second multiplexer reference voltage.

14. The apparatus of claim 13, further comprising an inverter coupled to an output of the comparator and to the first switch to invert a comparator output signal to generate the first comparator signal.

15. The apparatus of claim 13, further comprising logic coupled to cancel timing window error due to comparator delay.

16. A method, comprising:

for a predetermined number of times, charging a capacitor to first voltage and discharging the capacitor to a second voltage to define a first timing window;

counting a number of clock cycles that occur during the first timing window;

for the predetermined number of times, charging the capacitor to a third voltage and discharging the capacitor to the second voltage to define a second timing window;

counting a number of clock cycles that occur during the second timing window;

subtracting the number of clock cycles counted during the second timing window from the number of clock cycles counted during the first timing window to generate a third number of clock cycles; and determining whether the clock signal's frequency exceeds a predetermined threshold frequency based on the third number of clock cycles.

17. The method of claim 16, further comprising adjusting the third number of clock cycles for temperature.

18. The method of claim 16, further comprising:

storing a set of values corresponding to a set of temperatures; and comparing the third number of clock cycles to at least one value selected from among the set of values.

19. A computer program product, comprising:

first computer readable program code embodied in a computer usable medium to cause a computer to start a first timing window, to count clock cycles of a clock signal that occur during the first timing window, and to stop the first timing window;

second computer readable program code embodied in a computer usable medium to cause the computer to start a second timing window, to count clock cycles of the clock signal that occur during the second timing window, and to stop the second timing window;

third computer readable program code embodied in a computer usable medium to cause the computer to subtract the number of clock cycles counted during the second timing window from the number of clock cycles counted during the first timing window to generate difference;

fourth computer readable program code embodied in a computer usable medium to cause the computer to cease operations if the difference is greater than a threshold corresponding to a preselected frequency threshold for the clock signal; and fifth computer readable program code embodied in a computer usable medium to cause the computer to provide a first reference voltage during the first timing window and a second reference voltage during the second timing window, and to cause the computer to compare a voltage level of the device to the first and second reference voltages during the first and second timing windows, respectively.

20. The computer program product of claim 19, further comprising fifth computer readable program code embodied in a computer usable medium to cause the computer to determine the frequency of the clock signal as a function of the delay.

21. The computer program product of claim 19, further comprising fifth computer readable program code embodied in a computer usable medium to cause the computer to increment a counter during the first timing window and to decrement during the second timing window.

22. The computer program product of claim 19, further comprising fifth computer readable program code embodied in a computer usable medium to cause the computer to adjust the difference according to a temperature in the computer.

* * * * *